(12) United States Patent
Tran et al.

(10) Patent No.: US 6,365,430 B1
(45) Date of Patent: Apr. 2, 2002

(54) ANGLE CAVITY RESONANT PHOTODETECTOR

(75) Inventors: Dean Tran, Westminster; Edward A. Rezek, Torrance; Eric R. Anderson, Redondo Beach, all of CA (US)

(73) Assignee: TRW Inc., Redondo Beach, CA (US)

( * ) Notice: Subject to any disclaimer, the term of this patent is extended or adjusted under 35 U.S.C. 154(b) by 0 days.

(21) Appl. No.: 09/634,743

(22) Filed: Aug. 9, 2000

Related U.S. Application Data

(62) Division of application No. 09/274,945, filed on Mar. 23, 1999, now Pat. No. 6,207,975.

(51) Int. Cl.$^7$ ............................................... H01L 21/00
(52) U.S. Cl. ............................. 438/48; 438/57; 438/64; 438/65
(58) Field of Search ............................. 438/48, 65, 64, 438/57, 24; 257/184

(56) References Cited

U.S. PATENT DOCUMENTS

| | | |
|---|---|---|
| 5,038,356 A | 8/1991 | Botez et al. |
| 5,253,263 A | 10/1993 | Jansen et al. |
| 5,455,421 A | 10/1995 | Spears |
| 5,459,332 A | 10/1995 | Carruthers |
| 5,602,393 A | 2/1997 | Gerard |
| 5,978,401 A | * 11/1999 | Morgan |

* cited by examiner

*Primary Examiner*—Kevin M. Picardat
*Assistant Examiner*—D. M. Collins
(74) *Attorney, Agent, or Firm*—Harness, Dickey & Pierce, P.L.C

(57) ABSTRACT

An angle cavity resonant photodetector assembly (8), which uses multiple reflections of light within a photodetector (14) to convert input light into an electrical signal. The photodetector (14) has a combination of generally planar semiconductor layers including semiconductor active layers (20) where light is converted into an electrical output. The photodetector (14) is positioned relative to a waveguide (10), where the waveguide (10) has a waveguide active layer (22) located between a pair of waveguide cladding layers (24) and (26) and includes a first end (28) for receiving light and a second end (30) for transmitting the light to the photodetector (14). The photodetector (14) has a first reflector (12) and second reflector (16) that provides for multiple reflections across the semiconductor active layers (20). In another embodiment, the waveguide (10) is positioned on one side of a cavity (58) and the photodetector (64) is positioned at an opposite end of the cavity (58) such that the light from the waveguide (10) travels across the cavity (58). The photodetector (64) is angled relative to the propagation direction of the light. The photodetector includes the first reflector (62) and the second reflector (68), which causes the light to pass through different areas of the photodetector active layers (72).

3 Claims, 4 Drawing Sheets

ANGLE CAVITY RESONANT PHOTODETECTOR

This application is a Div. of Ser. No. 9-274,945 filed Mar. 23, 1999 now U.S. Pat. No. 6,207,975.

BACKGROUND OF INVENTION

1. Field of the Invention

This invention relates generally to semiconductor photodetectors and, more specifically, to an angle cavity resonant semiconductor photodetector that is able to generate an electrical output for a specific range of light using a waveguide and multiple reflectors to create a resonance of light within the photodetector.

2. Discussion of the Related Art

High frequency, wide bandwidth photodetectors, such as PIN photodiodes, that are used in a variety of systems for the transfer of light as a primary means of transferring information are known in the art. These systems are especially needed for high-speed communication systems, such as automatic teller machines, computer network systems, and multimedia applications.

Photodetectors are used to convert optical energy into electrical energy. A photodiode is typically used for high-speed applications. In high-speed applications, the speed and the responsivity of the photodetector are critical. Although fiber optic cable can transmit at speeds of greater than 100 GHz, current technology photodetectors are limited to 45–60 GHz bandwidths. With the current explosion of multimedia technologies and applications, such as the Internet, the telecommunications industry will require higher bandwidth systems such as optical systems with high speed phododiodes.

In the typical photodiode, an active semiconductor material generates an electrical current by the photogenerated electrons within the active material. Responsivity and speed are two variables that are often used to determine the performance of photodetectors. Responsivity is the measure of the effectiveness of a device in converting incident light to an output current. Speed is the measure of how quickly an output of the device changes in response to a change in the input to the device. For a photodiode to be effective in high-speed communication applications, it must have both a high responsivity and a high speed. Current high speed photodiodes typically have a responsivity of 0.2–0.4 amps/watt and a top end speed of 45–60 GHz. To increase the responsivity of a photodiode, the thickness of the active area is often increased so as to increase the quantum efficiency, thus creating more output current. This creates a problem, however, because a thicker active area increases the transit time, which decreases the speed.

Current high speed photodiode design must incorporate a tradeoff between quantum efficiency and bandwidth.

Most communication applications that involve photodiodes also require an optical coupling device for guiding the light to the photodiode active area. Since the requirements of the optical coupling device are to deliver the incident light to a relatively small area, typically there are a minimum number of components and materials that are required to carry out this task. Due to the difference of materials and the number of optical components that are used in the optical coupling device, there tends to be a high optical loss in the coupling device that degrades the overall performance of the photodiode.

State of the art optical communication systems have carriers of very high frequency that require the use of high-speed, high-responsivity photodetectors. As the demand for more information increases, so will the demand that communication systems be able to transmit more information, which will in turn require high-speed, high-responsivity photodetectors. The known photodetectors for high frequency applications are limited by having a low responsivity and a limited high-end frequency response. It has been recognized that the effectiveness of a communications system could be increased by providing a photodetector that employs multiple reflections between a waveguide and reflectors to produce a high responsivity and high-speed photodetector.

It is an object of the present invention to provide a resonant photodetector that provides for an increased responsivity and speed, as well as providing other improvements, over the known photodetectors, to improve the performance of the communication process.

SUMMARY OF THE INVENTION

In accordance with the teachings of the present invention, an angle cavity resonant photodetector assembly is disclosed that utilizes multiple reflections within a photodetector to convert an optical signal to a corresponding electrical signal output. The angle cavity resonant photodetector assembly includes a plurality of semiconductor layers that combine to define a waveguide, a photodetector, and supporting structure and circuitry.

The waveguide provides a path to direct light to the photodetector from a light source. The waveguide includes a first end that is positioned to receive light from the light source, and reduce the number of optical components required to couple the light to the photodetector. The waveguide further includes cladding layers that refract the light propagating through the waveguide towards the photodetector to limit the amount of light that escapes from the waveguide.

The photodetector includes a plurality of semiconductor layers aligned at an angle relative to the propagation direction of the light traveling through the waveguide. The photodetector semiconductor layers include first and second reflectors opposite each other for providing multiple reflections of the light propagating through the photodetector active area. This use of multiple reflections within the photodetector increases the quantum efficiency and allows for a smaller active area to be used in the photodetector while retaining or increasing the efficiency of operation.

Additional objects, advantages and features of the present invention will become apparent from the following description and appended claims, taken in conjunction with the accompanying drawings.

DETAILED DESCRIPTION OF THE PREFERRED EMBODIMENTS

The following discussion of the preferred embodiments of the present invention directed to a angle cavity resonant photodetector assembly is merely exemplary in nature, and is in no way intended to limit the invention or its applications or uses. For example, the description of the photodetector of the invention will be described for a PIN photodiode. However, the angle cavity resonant photodetector assembly of the invention may have application for other types of photodetectors and associated circuitry.

Figure 1:
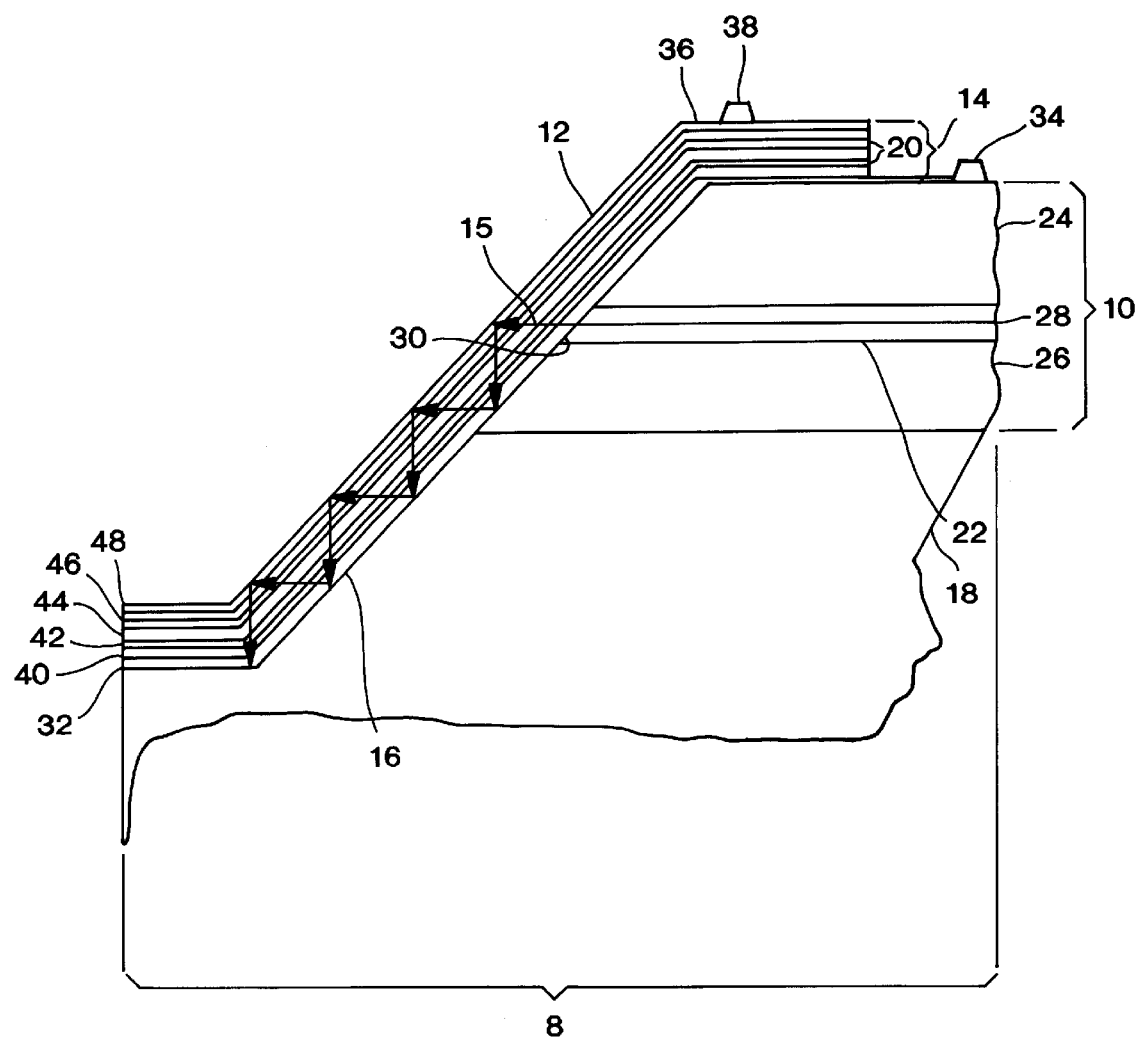
FIG. 1 is a sectional view of one embodiment of the angle cavity resonant photodetector assembly of the present invention.

FIG. 1 shows a cross-sectional view of an angle cavity resonant photodetector assembly 8, according to the invention. The resonant photodetector assembly 8 includes a plurality of semiconductor layers fabricated to define a waveguide 10, a photodetector 14, and a substrate wafer 18. A light beam 15 is collected by the waveguide 10 from a light source (not shown) and is directed to the photodetector 14 where it is absorbed, as will be discussed below. According to the invention, the photodetector 14 is positioned at an angle relative to the waveguide 10 and the propagation direction of the light beam 15 through the waveguide 10. The light absorbed by the photodetector 14 is converted to an electrical output that is conveyed to various associated circuitry (not shown) depending on the particular application.

The waveguide 10 includes a waveguide active layer 22 surrounded by an upper waveguide cladding layer 24 and a lower waveguide cladding layer 26. A first end 28 of the waveguide 10 receives the light beam 15 to be detected. The light beam 15 is directed down the waveguide active layer 22 by reflections off of the waveguide cladding layers 24 and 26 to a second end 30 of the waveguide 10. The second end 30 of the waveguide 10 is positioned adjacent to the photodetector 14 so that the light beam 15 is directed from the waveguide active layer 22 into the photodetector 14.

The photodetector 14 includes first and second reflector layers 12 and 16, an n contact semiconductor layer 32, an n contact metal 34, a plurality of semiconductor active layers 20, a p contact layer 36, and a p contact metal 38. The reflector layers 12 and 16 define the outside layers of the photodetector 14, where the active layers 20 are positioned between the reflector layers 12 and 16. The second end 30 of the waveguide 10 is positioned adjacent to the second reflector layer 16, and the reflector layer 12 is positioned on an opposite side of the active layers 20 from the reflector layer 16. The light beam 15 propagating down the waveguide 10 passes through the second reflector layer 16 and enters the semiconductor active layers 20. The semiconductor active layers 20 absorb the light passing through the layers 20 to convert the absorbed light into an electrical signal. The light that is not absorbed by the semiconductor active layers 20 is reflected off of the first reflector layer 12, and is directed back through the semiconductor active layers 20. The unabsorbed light continues to be reflected between the first reflector layer 12 and the second reflector layer 16 at different locations through the active layers 20 until it is eventually absorbed by the semiconductor active layers 20. As shown, the angled configuration of the photodetector 14 relative to the propagation direction of the light beam 15 through the waveguide 10 causes the light beam 15 to be reflected downwards off of the reflector layer 12 at each reflection point in this embodiment. Of course, the orientation of the photodetector 14 relative to the waveguide 10 can be different in different embodiments that would change the reflection direction of the beam 15. The angled orientation of the photodetector causes the reflected beam 15 to travel through different portions of the active layers 20.

Due to the maximum utilization of the light received from the waveguide 10 by the angle cavity resonant photodetector assembly 8, a much smaller semiconductor active region is required to convert the light into an electrical signal than a conventional photodetector known in the art. Having a smaller active area increases the speed of the photodetector 14. Having opposing reflectors 12, 16 causes the light to pass through the absorbing layers 20 multiple times. This increases the responsivity compared to photodetector in the known art. In the present embodiment of the invention, the responsiveness of the photodetector 14 is above 1 amp/waft compared to the typical response of 0.2–0.4 amp/waft for a photodetector in the known art. Additionally, a greater bandwidth of light can be absorbed by the photodetector 14. The photodetector 14 can convert light with a bandwidth greater than 100 GHz. Typical photodetectors known in the art can only convert light at bandwidths up to 45–60 GHz.

In the present embodiment of the invention, the substrate layer 18 is made of semi-insulated InP, the waveguide active layer 22 is composed of InGaAs and both the waveguide cladding layers 24 and 26 are composed of InP. However, as will be appreciated by those skilled in the art, other semiconductor materials that are suitable for light propagation can be used. To allow the light beam 15 to enter the photodetector 14 with minimal losses, the composition of the waveguide active layer 22 is made such that the index of refraction n of the waveguide active layer 22 matches the index of refraction n of the second reflector layer 16. More specifically, using Afromowitz's equation, known to those skilled in the art, the index of refraction n of the waveguide active layer 22 is determined from terms, which are dependent on the composition of the waveguide active layer 22. That is:

$$n^2 = 1 + E_d/E_o + E_d E^2/E_o^3 + \eta E^4/\pi \ln[(2E_o^2 - E_g^2 - E^2)/(E_g^2 - E^2)] \quad (1)$$

In this equation, $E_o$ is the alloy photon energy; $E_d$ is the dispersive energy of the photons in the alloy; $\eta$ is a mathematical term; $E_g$ is the band gap energy; and E is the energy of light. Any suitable technique known in the art can, however, be used to match the active layer 22 to the reflector layer 16. In the preferred embodiment of the invention, the layer 22 is In(x)Ga(1-x)As(y)P(1-y), where the value of x is 0.53 and the value of y is 1, thus yielding a composition of In(0.53)Ga(0.47)As for light with wavelength from 1.2 to 1.55 micrometers.

In one embodiment, the photodetector 14 is a PIN type photodiode, but other types of photodetectors may be used within the scope of the present invention. The semiconductor active layers 20 include two intrinsic InGaAs layers 42 and 46. The first reflector layer 12 has a highly reflective gold mirror coating. The second reflector layer 16 is a semiconductor reflector, such as a Bragg reflector, and includes a series of alternating layers of n doped GaP and GaInP layers. To achieve maximum reflectivity, the reflector layer 16 has thirty-six alternating layers, although a different number of layers or composition may be used. The p contact layer 36 is a heavily p doped InGaAs layer and the n contact layer 32 is a heavily n doped InP layer. The p contact 38 is positioned on the gold mirror coating of the first reflector layer 12. The n contact 34 is positioned on the uncovered portion of the n contact layer 32.

Figure 2:
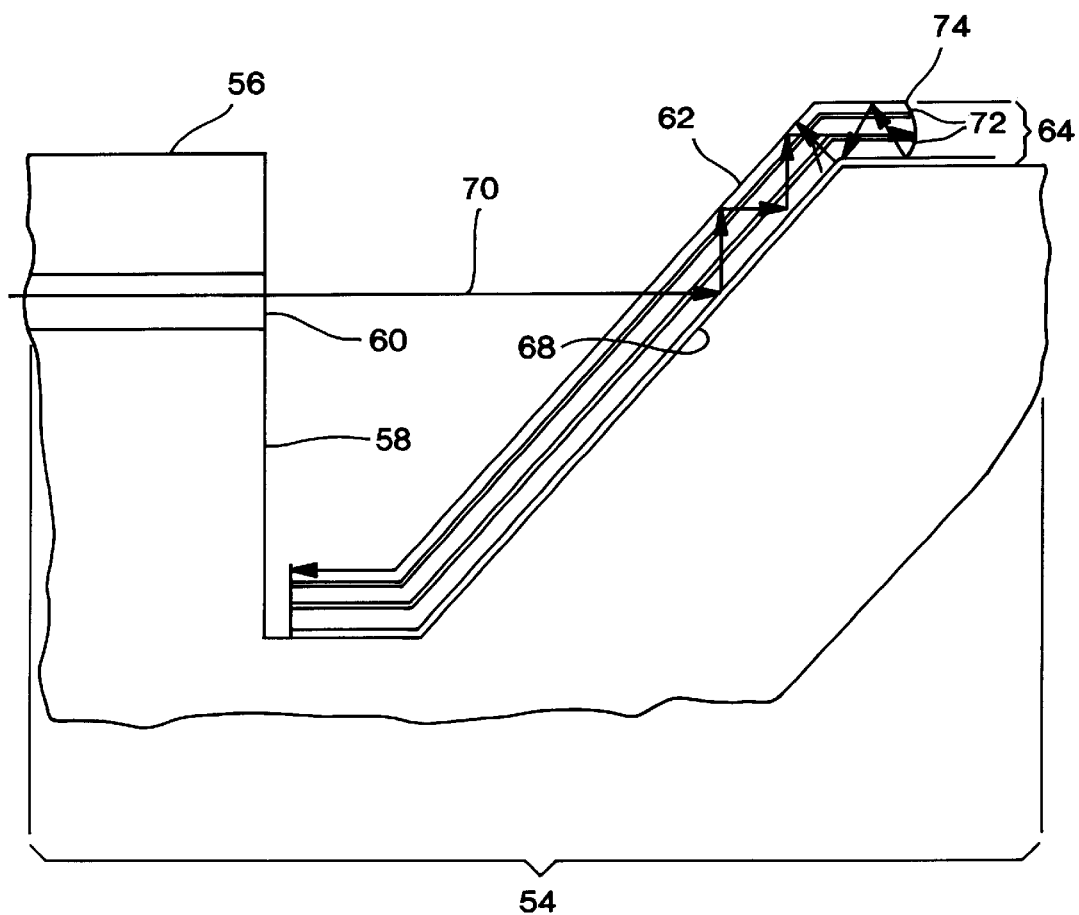
FIG. 2 is a sectional view of another embodiment of the angle cavity resonant photodetector assembly of the present invention.

FIG. 2 shows another embodiment of an angle cavity resonant photodetector assembly 54, according to the present invention., that has similarities to the assembly 8 discussed above. The assembly 54 includes a waveguide having a waveguide active layer 56 positioned on one side of a cavity 58 and a photodetector 64 positioned on an opposite side of the cavity 58. The photodetector 64 is the same as the photodetector 14 discussed above. A cavity end 60 of the waveguide active layer 56 transmits a light beam 70 across the cavity 58 that is received by the photodetector 64. As discussed above for the photodetector 14, the photodetector 64 includes a first semiconductor reflector layer 62, a plurality of semiconductor active layers 72 and a second semiconductor reflector layer 68. The reflector layers 62 and 68 are positioned on opposite sides of the active layers 72, as shown. The reflector layer 62 is index of refraction matched to the air within the cavity 58 as much as possible, so that the light beam 70 enters the photodetector 64 through the reflector layer 62, as shown, with minimal losses. The light that enters the photodetector 64 is absorbed by the active layers 72. The light that is not absorbed by the active layers 72 is reflected off of the reflector layer 68 to give the unabsorbed light another chance to be absorbed by the active layers 72. Multiple reflections off of the reflector layer 62 and 68 provide multiple chances for the light beam 70 to be absorbed by the active layers 72, as shown. In this embodiment, the light beam 70 is reflected upwards off of the reflector layer 68 because of the orientation of the waveguide active layer 56 to the photodetector 64. Since the reflector layer 62 is not positioned against the waveguide, additional sources of light may be directed to the photodetector 64. This allows the photodetector 64 to receive light from multiple sources and to detect multiple wavelengths.

Figure 3A:
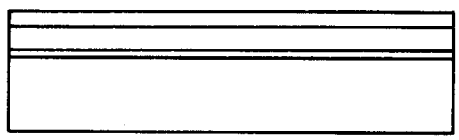
FIGS. 3a–3f illustrates the steps in the fabrication of one embodiment of the angle cavity resonant photodetector assembly of the invention.
Figure 3B:
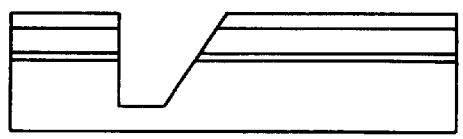
Figure 3C:
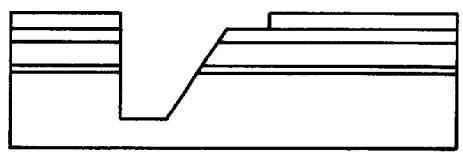
Figure 3D:
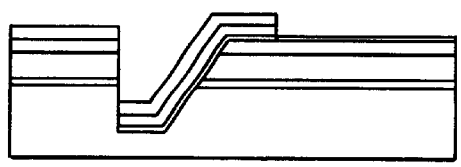

The formation of the angle cavity resonant photodetector assembly 8 of the present embodiment of the invention follows conventional techniques and methods, some of which are illustrated in FIGS. 3a–3f according to one embodiment. Referring to FIG. 3a, the waveguide 10 is formed by the formation of the substrate wafer 18, the lower waveguide cladding layer 26 of undoped InP with a thickness about 2 $\mu$m, the waveguide active layer 22 of undoped InGaAsP with a thickness about 4 $\mu$m, and the upper waveguide cladding layer 24 of undoped InP with a thickness about 3 $\mu$m. These layers are grown on the semiconductor supporting structure by conventional epitaxial growth processes, such as molecular beam epitaxy (MBE) or metalorganic chemical vapor deposition (MOCVD). Referring to FIG. 3b, the waveguide fabrication is performed by etching an angled cavity for subsequent photodetector crystal growth structure. Referring to FIG. 3c, a layer of silicon dioxide or silicon nitride is deposited, for surface passivation, on the angle cavity resonant photodetector assembly 8 with the exception of the area reserved for the photodetector 14. Referring to FIG. 3d, a selective regrowth for the photodetector 14 is performed on the waveguide 10.

Figure 3E:
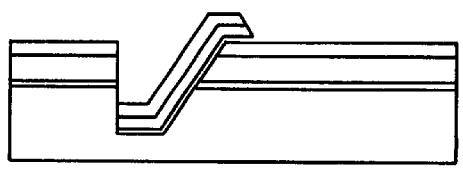
Figure 3F:
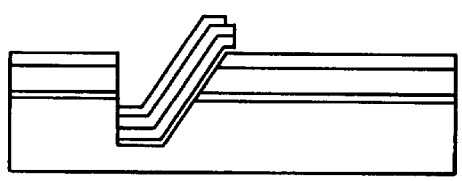

The selective regrowth of the photodetector 14 includes forming the semiconductor reflector layer 16 having a number of alternating n-doped GaP and GaInP layers where the number and thickness of the layers are selected to provide the desired reflectivity; forming the n contact layer 32 of heavily doped InGaAs with a thickness of about 150 nm; forming the semiconductor active layers 20, including forming the two InGaAs layers 42 and 46 with about 30 nm thickness and spaced about 150 nm apart. Referring to FIG. 3e, an edge trim etch is performed on the photodetector 14 to open the n contact layer 32 for the n contact 34 connection. Referring to FIG. 3f, the p contact 38 and the n contact 34 are formed with the p contact 38 consisting of Ti—Pt—Au and the n contact 34 consisting of Ni—AuGe—Ni—Au. A gold coating is applied to the p contact layer 36 on the photodetector 14. The completely formed angle cavity resonant photodetector assembly 8 wafer is then cut as needed and tested to specification.

Figure 4A:
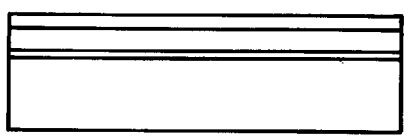
FIGS. 4a–4f illustrates the steps in the fabrication of another embodiment of the angle cavity resonant photodetector assembly of the invention.
Figure 4B:
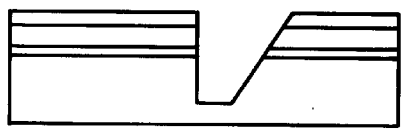
Figure 4C:
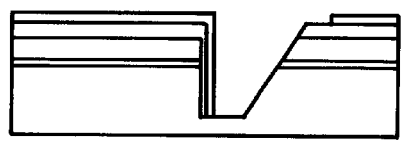
Figure 4D:
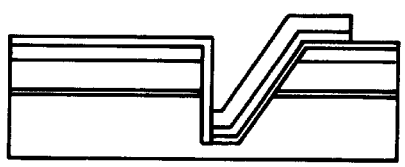
Figure 4E:
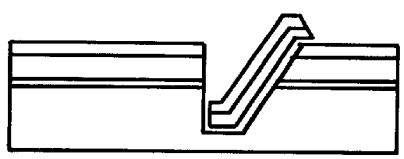
Figure 4F:
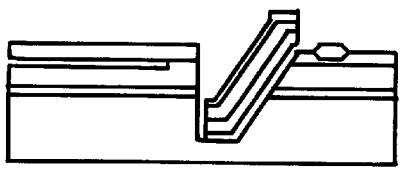

The fabrication procedure used for the embodiment of the invention as illustrated in FIGS. 3a–3f is the same fabrication procedure as used on the other embodiment of the invention as illustrated in FIGS. 4a–4f with the exception that, referring to FIG. 4f, the semiconductor reflector layer 62 is applied to the p contact layer 74 on the photodetector 64 instead of the gold coating being applied to the p contact layer 74.

The foregoing discussion discloses and describes merely exemplary embodiments of the present invention. One skilled in the art will readily recognize from such discussion, and from the accompanying drawings and claims, that various changes, modifications and variations can be made therein without departing from the spirit and scope of the invention as defined in the following claims.

What is claimed is:

1. A method for the fabrication of an angle cavity resonant photodetector assembly comprising:

forming a semiconductor supporting structure, including a substrate;

forming a waveguide on said semiconductor supporting structure including a waveguide active layer for transmitting light and a pair of waveguide cladding layers for reflecting said light;

etching an angle recess in said waveguide at an angle relative to a light propagation direction of the waveguide active layer where the angle recess depth extends in said waveguide to at least below said waveguide active layer;

forming a first reflector of the photodetector assembly for reflecting light into the photodetector;

forming semiconductor active layers on said angle recess to convert light into an electrical signal;

forming a second reflector on the opposite side of said active layers from the first reflector for reflecting light into the photodetector assembly; and forming a pair of electrical contacts, one on a contact layer in the waveguide and the other on a contact layer in the photodetector assembly for conveying the electrical output of the photodetector.

2. The method as defined in claim 1 wherein the reflectors formed for the photodetector are semiconductor reflectors.

3. The method as defined in claim 1 wherein the contact layer formed on the photodetector is coated with gold.

* * * * *